(12) United States Patent
Yoo et al.

(10) Patent No.: US 6,211,082 B1
(45) Date of Patent: *Apr. 3, 2001

(54) CHEMICAL VAPOR DEPOSITION OF TUNGSTEN USING NITROGEN-CONTAINING GAS

(75) Inventors: Bong-young Yoo; Byung-Lyul Park, both of Seoul; Dae-hong Ko; Sang-in Lee, both of Kyungki-do, all of (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/021,462

(22) Filed: Feb. 10, 1998

(51) Int. Cl.$^7$ .................................................. H01L 21/44
(52) U.S. Cl. ........................... 438/680; 438/681; 438/685
(58) Field of Search .................................. 438/680, 681, 438/685

(56) References Cited

U.S. PATENT DOCUMENTS

| 4,612,257 | * | 9/1986 | Broadbent | 428/620 |
| 5,028,565 | | 7/1991 | Chang | 437/192 |
| 5,691,235 | * | 11/1997 | Meikle | 438/680 |
| 5,888,588 | * | 3/1999 | Nagabushnam | 427/248.1 |

FOREIGN PATENT DOCUMENTS 95-37760   10/1995  (KR) .

OTHER PUBLICATIONS

Tsai et al., "Layer Tungsten and Its Applications for VLSI Interconnects", IEDM Technical Digest, Dec. 11–14, 1988, pp. 462–465.

* cited by examiner

*Primary Examiner*—Charles Bowers
*Assistant Examiner*—Nema Berezny

(57) ABSTRACT

A tungsten or other metal layer is chemical vapor deposited using a source gas containing tungsten, a reducing gas and a nitrogen-containing gas. The nitrogen-containing gas can act as a surface roughness reducing gas that reduces the roughness of the tungsten layer compared to a tungsten layer that is chemical vapor deposited using the source gas containing tungsten and the reducing gas, but without using the surface roughness reducing gas. Viewed in another way, the nitrogen-containing gas acts as a growth rate controlling gas that produces uniform growth of the tungsten layer in a plurality of directions compared to a tungsten layer that is deposited using the source gas containing tungsten and the reducing gas, but without using the growth rate controlling gas.

8 Claims, 2 Drawing Sheets

CHEMICAL VAPOR DEPOSITION OF TUNGSTEN USING NITROGEN-CONTAINING GAS

FIELD OF THE INVENTION

This invention relates to integrated circuit fabrication methods, and more particularly to methods of forming conductive layers on integrated circuits.

BACKGROUND OF THE INVENTION

As the integration density of integrated circuit devices continues to increase, it may become increasingly difficult to provide high density conductive interconnections between the active devices in the integrated circuit. In order to provide high performance interconnections, tungsten is often used as an interconnection material. The tungsten layer may be formed by Chemical Vapor Deposition (CVD). CVD tungsten can have high performance characteristics compared to aluminum or polycide.

Tungsten is generally chemical vapor deposited using a source gas containing tungsten and a reducing gas. A typical source gas used is tungsten hexafluoride ($WF_6$). The reducing gas may be hydrogen and/or silane ($SiH_4$). The deposition of tungsten may be obtained by the following reactions:

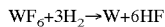

$WF_6 + 3H_2 \rightarrow W + 6HF$

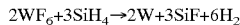

$2WF_6 + 3SiH_4 \rightarrow 2W + 3SiF + 6H_2$

Unfortunately, a tungsten layer grown using the above CVD reactions may grow too rapidly. During this rapid growth, the tungsten may tend to grow in a crystalline manner, so that it grows preferentially in one direction compared to other directions. This rapid and/or preferential growth may cause the surface of the tungsten layer to be rough. The roughness of the tungsten surface may cause adhesion problems during subsequent microelectronic processing and may cause other problems that can also impact performance during subsequent processing.

One technique for reducing the surface roughness of tungsten is described in a publication by Tsai et al. entitled "*Layer Tungsten and Its Applications for VLSI Interconnects*", IEDM Technical Digest, 1988, pp. 462–465. As described, tungsten grain growth is interrupted using a layer of thin silicon and the silicon layer is consumed during subsequent tungsten deposition, to thereby form tungsten films with fine grains. Unfortunately, this technique interrupts the tungsten deposition process with a silicon deposition process, and may thereby complicate processing.

It is also known to provide an antireflective coating to reduce the roughness of the surface of the tungsten layer. The antireflective coating may also increase the processing complexity.

SUMMARY OF THE INVENTION

It is therefore an object of the present invention to provide improved methods of forming tungsten layers on integrated circuit substrates.

It is another object of the present invention to provide tungsten layers with reduced roughness.

It is still another object of the present invention to provide reduced roughness tungsten layers without requiring interruption of the tungsten deposition process and without requiring the addition of antireflective layers.

These and other objects are provided according to the present invention, by chemical vapor depositing a tungsten layer on an integrated circuit substrate using a source gas containing tungsten, a reducing gas and a nitrogen-containing gas. The nitrogen-containing gas can act as a surface roughness reducing gas that reduces the roughness of the tungsten layer compared to a tungsten layer that is chemical vapor deposited using the source gas containing tungsten and the reducing gas, but without using the surface roughness reducing gas. Viewed in another way, the nitrogen-containing gas acts as a growth rate controlling gas that produces uniform growth of the tungsten layer in a plurality of directions compared to a tungsten layer that is deposited using the source gas containing tungsten and the reducing gas, but without using the growth rate controlling gas.

The reducing gas is preferably selected from the group consisting of $SiH_4$, $H_2$, $SiH_2Cl_2$, $Si_2H_6$, $B_2H_6$ and $SiH_2F_2$. The source gas containing tungsten is preferably tungsten hexafluoride ($WF_6$). The nitrogen-containing gas may be an organic compound or an inorganic compound containing nitrogen. An inorganic compound containing nitrogen is preferably selected from the group consisting of nitrogen gas ($N_2$) and ammonia ($NH_3$). An example of an organic compound containing nitrogen is methyl hydrazine ($CH_6N_2$).

Accordingly, tungsten is chemical vapor deposited by injecting a material containing nitrogen in addition to the source gas and reducing gas, to thereby reduce the roughness of the surface of the tungsten layer. Defects caused by excessive surface roughness can thereby be reduced or eliminated, without requiring interrupted tungsten deposition processes or requiring the formation of antireflective coating layers. It will also be understood that the use of nitrogen-containing gas can be used in other metal deposition processes wherein a metal source gas and a reducing gas are used.

DETAILED DESCRIPTION OF PREFERRED EMBODIMENTS

Figure 1:
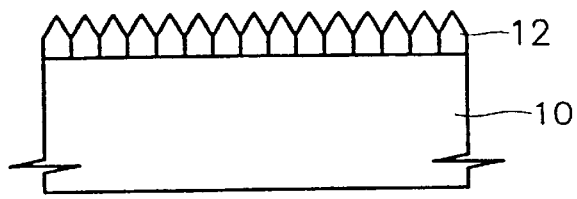
FIG. 1 is a cross-sectional view of a conventional tungsten layer.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present In contrast, when an element is referred to as being "directly on" another element, there are no intervening elements present Moreover, each embodiment described and illustrated herein includes its complementary conductivity type embodiment as well.

According to the present invention, a tungsten layer is formed by injecting a material containing nitrogen to control the growth rate, in addition to a source gas and a reducing gas during deposition of tungsten, to reduce the surface roughness of the tungsten layer. The tungsten layer is deposited by a CVD method. The source gas during CVD deposition of the tungsten layer employs a deposition gas containing tungsten such as $WF_6$ or $WCl_6$. The reducing gas is preferably selected from the group consisting of $SiH_4$, $H_2$, $SiH_2Cl_2$, $Si_2H_6$, $B_2H_6$ and $SiH_2F_2$. Also, the source gas and the reducing gas may employ a carrier gas for a smooth flow. The material for controlling the growth rate is an inorganic or organic compound containing nitrogen. It is preferable that the inorganic compound is $N_2$ or $NH_3$, and the organic compound is methyl hydrazine.

The tungsten layer is deposited using a CVD apparatus at a pressure of between about 0.01 and 1 Torr, at a temperature of between about 300 and 700° C., with a flow ratio of the reducing gas to the source gas of between about 0 and 500, and a flow ratio of the gas for controlling the growth rate to the source gas of between about 0.2 and 4.

Figure 2:
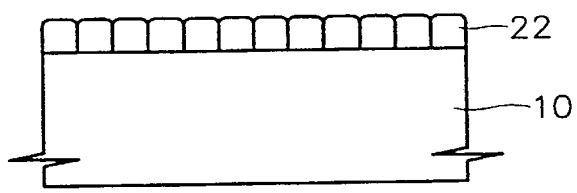
FIG. 2 is a cross-sectional view of a tungsten layer that is chemical vapor deposited according to the present invention.

In detail, referring to FIG. 1, a conventional tungsten layer formed on a substrate such as a wafer 10 has crystal grains 12 which grow at a sharp angle. Accordingly, broad grooves may be formed between crystals. In contrast, referring to FIG. 2, the structure of the crystal grains 22 of a tungsten layer formed on a wafer 10 through deposition according to the present invention is rounded. Accordingly, broad grooves between crystals may be reduced.

XRD Measurement on a Tungsten Layer

The quality of the tungsten layer according to the present invention was measured as follows. The tungsten layer was deposited using a CVD apparatus at a pressure of between about 0.01 and 1 Torr, a temperature of 500° C., a flow ratio of $NH_3/WF_6$ of 2 and a flow ratio of $H_2/WF_6$ of 100. The pressure in the reaction chamber was $10^{-4}$ Torr or less to minimize the effect of remnants existing in the reaction room of the CVD apparatus.

Figure 3:
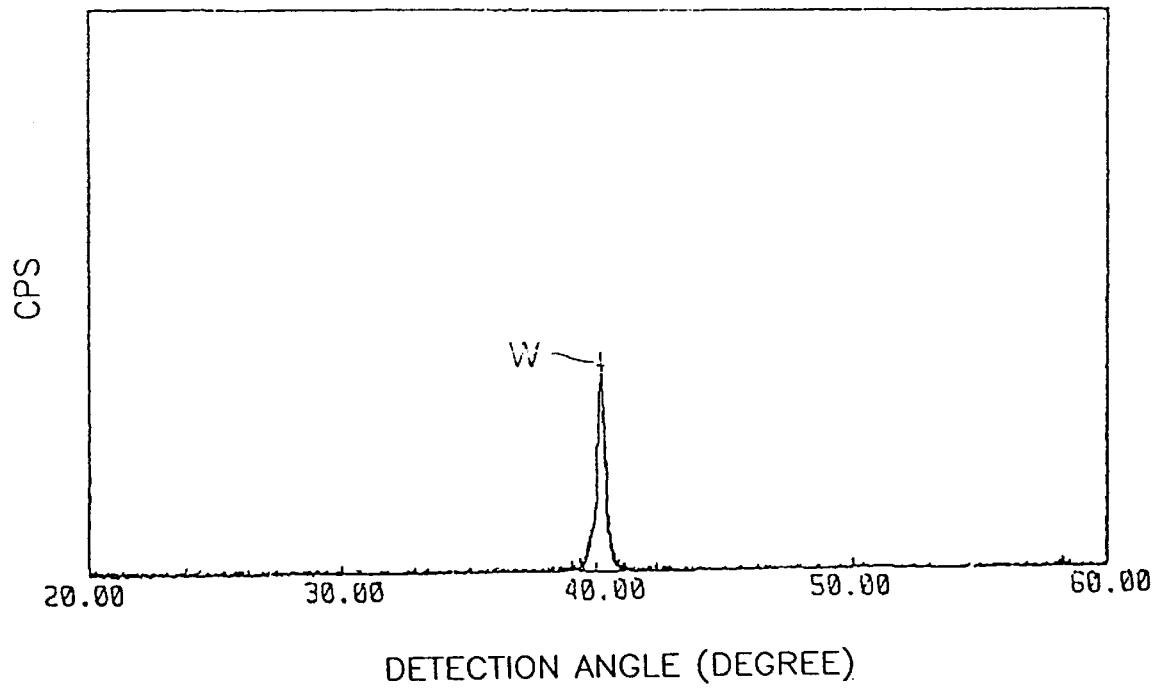
FIG. 3 graphically illustrates X-ray diffraction (XRD) analysis of a tungsten layer that is deposited according to the present invention.

X-ray diffraction (XRD) analysis result of the metal layer formed by the above conditions is shown in FIG. 3. The X-axis indicates a detection angle, and the Y-axis indicates counts/sec (CPS). When analyzing a conventional tungsten layer using the XRD method, elements in the layer have their own detection angles. For example, tungsten was detected from approximately 40°, and $WN_x$ was detected from approximately 35° or 45°. Referring to FIG. 3 however, a metal layer according to the present invention appeared to be a pure tungsten layer having no $WN_x$.

AFM Analysis on a Tungsten Layer

Figure 4:
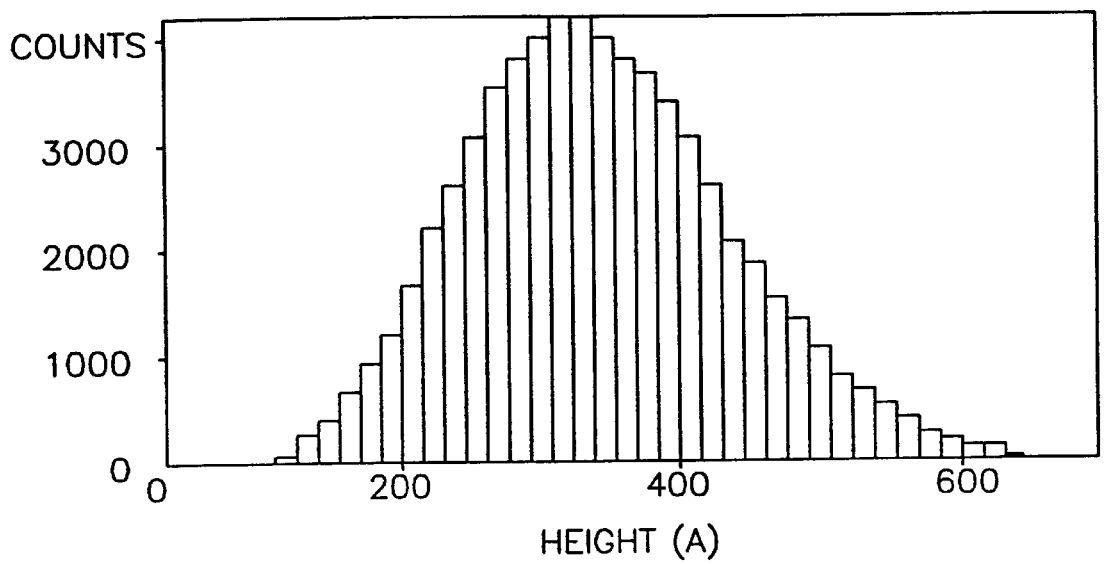
FIG. 4 is a histogram of an atomic force microscope (AFM) analysis of the surface of a conventional tungsten layer.
Figure 5:
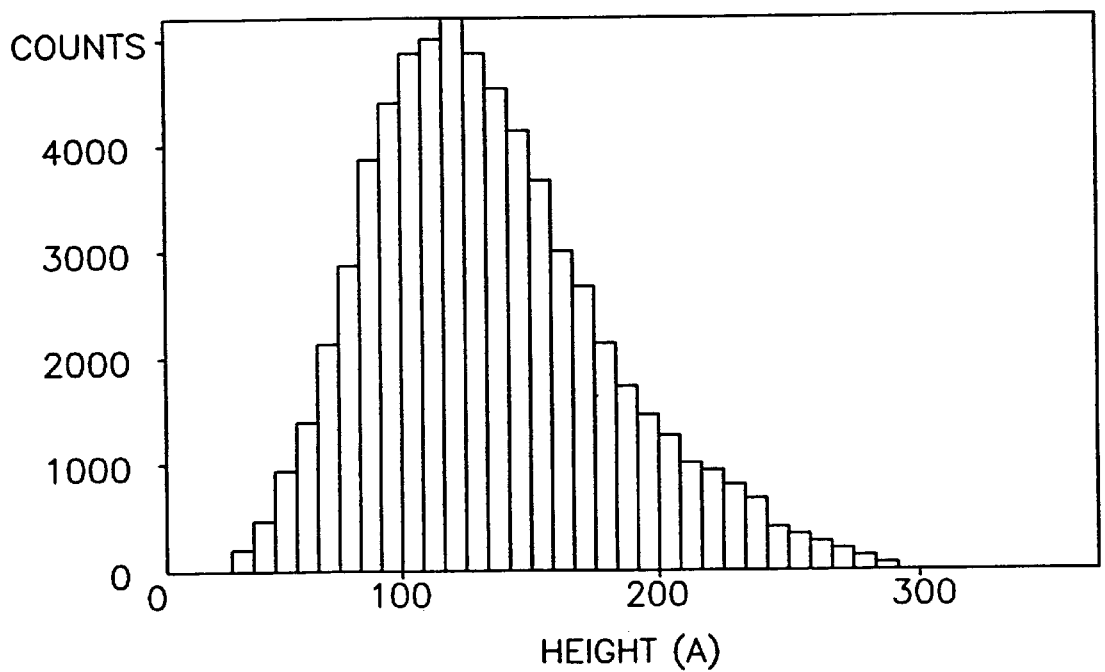
FIG. 5 is a histogram of an AFM analysis of the surface of a tungsten layer according to the present invention.

In FIGS. 4 and 5, the X-axis indicates height (in Å) of a peak to valley at a measuring point of a surface of a tungsten layer by an atomic force microscope (AFM)

Referring to FIG. 4, the surface of a conventional tungsten layer had a root mean square (RMS) roughness of 113 Å and a mean roughness of 89 Å. Referring to FIG. 5, the surface of a tungsten layer according to the present invention had a RMS roughness of 46 Å and a mean roughness of 36Å. Accordingly, the surface roughness of the tungsten layer according to the present invention may be up to one-half or less of that of the conventional tungsten layer.

Accordingly, a tungsten layer is formed by injecting a material containing nitrogen, i.e., a material that controls the growth rate, in addition to the source gas and the reducing gas during deposition of the tungsten, to thereby reduce the roughness of the surface of the tungsten layer. Therefore, adhesion failure of a photoresist film occurring during a subsequent photolithography process after deposition of the tungsten layer may be reduced or prevented. Notching formed on sidewalls of the photoresist film during an alignment exposure also may be reduced or suppressed, to thereby improve the profile of an interconnection. Moreover, the present invention can reduce the surface roughness of the tungsten layer without using additional processing steps.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a tungsten layer consisting essentially of elemental tungsten on an integrated circuit substrate comprising the step of:

chemical vapor depositing the tungsten layer consisting essentially of elemental tungsten on the integrated circuit substrate at a pressure of between about 0.01 and 1 Torr using a source gas containing tungsten, a reducing gas, and a surface roughness reducing gas consisting of $NH_3$ that reduces the roughness of the tungsten layer so deposited compared to a tungsten layer that is chemical vapor deposited using the source gas containing tungsten and the reducing gas, but without using the surface roughness reducing gas.

2. A method according to claim 1 wherein the reducing gas is selected from the group consisting of $SiH_4$, $H_2$, $SiH_2Cl_2$, $Si_2H_6$, $B_2H_6$ and $SiH_2F_2$.

3. A method for forming a conductive layer on an integrated circuit substrate comprising the step of:

depositing a metal layer consisting essentially of elemental metal on the integrated circuit substrate at a pressure of between about 0.01 and 1 Torr using a source gas containing the metal, a reducing gas, and a growth rate controlling gas consisting of $NH_3$ that produces uniform growth of the metal layer in a plurality of directions compared to a metal layer that is deposited using the source gas containing the metal and the reducing gas, but without using the growth rate controlling gas.

4. A method according to claim 3 wherein the reducing gas is selected from the group consisting of $SiH_4$, $H_2$, $SiH_2Cl_2$, $Si_2H_6$, $B_2H_6$ and $SiH_2F_2$.

5. A method of forming a tungsten layer consisting essentially of elemental tungsten on an integrated circuit substrate comprising the step of:

chemical vapor depositing the tungsten layer consisting essentially of elemental tungsten on the integrated circuit substrate at a pressure of between about 0.01 and 1 Torr using a source gas containing tungsten, a reducing gas, and a surface roughness reducing gas consisting of a gas of an organic compound containing nitrogen that reduces the roughness of the tungsten layer so deposited compared to a tungsten layer that is chemical vapor deposited using the source gas containing tungsten and the reducing gas, but without using the surface roughness reducing gas.

6. A method according to claim 5, wherein the gas of an organic compound containing nitrogen in methyl hydrazine.

7. A method for forming a conductive layer on an integrated circuit substrate comprising the step of:

depositing a metal layer consisting essentially of elemental metal on the integrated circuit substrate at a pressure of between about 0.01 and 1 Torr using a source gas containing the metal, a reducing gas, and a growth rate controlling gas consisting of a gas of an organic compound containing nitrogen that produces uniform growth of the metal layer in a plurality of directions compared to a metal layer that is deposited using the source gas containing the metal and the reducing gas, but without using the growth rate controlling gas.

8. A method according to claim 7, wherein the gas of an organic compound containing nitrogen is methyl hydrazine.

* * * * *

UNITED STATES PATENT AND TRADEMARK OFFICE
CERTIFICATE OF CORRECTION

PATENT NO.    : 6,211,082 B1
DATED         : April 3, 2001
INVENTOR(S)   : Yoo et al.

It is certified that error appears in the above-identified patent and that said Letters Patent is hereby corrected as shown below:

Column 2,
Line 20, should read:
-- nitrogen. An inorganic compound containing nitrogen is --
Line 67, should read:
-- element or intervening elements may also be present. In --

Column 3,
Line 3, should read:
-- present. Moreover, each embodiment described and illus- --
Line 61, should read:
-- layer by an atomic force microscope (AFM). --

Column 5,
Line 2, should read:
-- organic compound containing nitrogen is methyl hydrazine. --

Signed and Sealed this

Twenty-eighth Day of January, 2003

JAMES E. ROGAN
*Director of the United States Patent and Trademark Office*